United States Patent [19]

Hanson et al.

[11] 4,003,413

[45] Jan. 18, 1977

[54] MACHINES FOR REFORMING AND REPACKAGING COMPONENTS

[75] Inventors: Waldo B. Hanson, Rowley; Ralph A. Morrison, Topsfield; Armand L. Tardiff, Salem, all of Mass.

[73] Assignee: USM Corporation, Boston, Mass.

[22] Filed: Aug. 1, 1975

[21] Appl. No.: 600,963

[52] U.S. Cl. .................................. 140/1; 140/105; 72/DIG. 10

[51] Int. Cl.² ......................................... B21F 45/00

[58] Field of Search ..................... 140/1, 105, 147; 29/203 B, 203 D; 72/DIG. 10

[56] References Cited

UNITED STATES PATENTS

| | | | |
|---|---|---|---|
| 3,075,562 | 1/1963 | Jankowski | 140/1 |
| 3,245,193 | 4/1966 | Schmidt | 140/147 |
| 3,286,740 | 11/1966 | Fuchs et al. | 140/1 |
| 3,396,758 | 8/1968 | Hall | 140/1 |

*Primary Examiner*—Lowell A. Larson
*Attorney, Agent, or Firm*—Donald N. Halgren; Richard B. Megley; Vincent A. White

[57] ABSTRACT

Electrical components having generally parallel leads extending in one direction from one side of their bodies, respectively, are successively transferred to a conveyor means movable through sequential processing stations to prepare the leads for circuit board connection or sequencing preparatory to such connection. Spaced lead grippers on the conveyor means control lead portions adjacent to the bodies of the components. The stations sucessively act to determine the standoff length of the leads from the bodies of the components, reform remaining portions of the leads in coaxial relation while maintaining the standoff length, check for omission of a reformed component from proper position in the series and, upon release from the grippers, tape the coaxial portions of the leads of adjacent components in parallel, side-by-side relation. Preferably, the means for checking reformed component presence also controls turning of a reel for storing the repackaged components.

14 Claims, 15 Drawing Figures

MACHINES FOR REFORMING AND REPACKAGING COMPONENTS

BACKGROUND OF THE INVENTION

1. Field of the Invention

The present invention is concerned with providing improved machinery for processing leads and more particularly for gaining precise control over the ends of reformed component leads to facilitate their subsequent automatic assembly in electrical circuits.

2. Description of the Prior Art

Many different types of electrical components are manufactured and supplied with their leads extending generally parallel from corresponding sides or portions of their component bodies. In order to facilitate their subsequent automatic insertion in printed circuit boards or the like, it is first desirable to assure straightness of the leads and to reform them with oppositely extending, coaxial portions. Moreover, it is frequently found desirable to retain in each component adjacent to its body predetermined shorter lead portions, the "standoff" length, which will support the component body above the circuit board, remaining portions of the leads being adequate for clinching plus a range of selected leg spacing as dictated by the spacing of preformed lead receiving holes in the board. The components as received from a supplier may be interconnected by tapes or magazine mounting means extending across their generally parallel leads, making it necessary to eliminate such tape or mounting as a preliminary step to suitably reforming the leads and thereafter reconnecting them with their ends spaced by new feed tape or the like.

Various lead straightening and/or taping mechanisms have previously been provided. A few are disclosed in the following U.S. Pat. Nos. 2,771,206; 2,928,452; 3,151,387; 3,349,813; 3,404,712; 3,344,816; 3,421,284; 3,520,336, 3,525,372; 3,570,559; 3,616,089; 3,636,624; 3,687,172. Additionally, numerous component inserting machines (such as that shown for instance in U.S. Pat. No. 3,777,350) have hitherto incorporated lead cutting and forming means, the latter often being concerned with converting coaxial leads to a U-shaped or staple configuration prior to insertion of the lead ends.

So far as we are aware, there is no available reliable machine for converting parallel "one direction" component leads to coaxial or oppositely extending lead type components.

In view of the foregoing, it is a main object of this invention to provide a machine for receiving lead-taped or magazine components having radial or parallel leads and then successively transforming and repackaging them as essentially coaxial lead type components ready for installation in a circuit.

Another object of the invention is to provide an efficient machine for converting electronic components having generally unidirectional leads to standoff components having leads which project coaxially in opposite directions from their standoff portions.

SUMMARY OF THE INVENTION

A plurality of operating stations are provided on a machine for sequentially processing component leads between a loading position and a delivery position. Lead gripping means on an indexable carrier are arranged to seize the leads of each arriving component. The leads of each component at a next operating station are given a predetermined standoff length. In proceeding to a succeeding station the remaining portions of the leads are formed coaxially and substantially at right angles to their standoff portions and then checked for normality at the penultimate station. Then in a final operation at a subsequent station the lead gripping means release the components to taping means for interconnecting the reformed leads at their outer extremities in uniformly spaced relation. Preferably, the gripping means comprises a plurality of lead gripping jaws mounted at spaced circumferential localities on a rotatable wheel to present each component appropriately at the successive stations. A hub cam controlled mechanism is alternatively provided for appropriately determining lead standoff lengths prior to operation of lead forming mechanism with the jaws to direct each pair of leads coaxially from their respective standoff portions.

It will be understood that in various aspects the invention is not limited to providing a machine for operating on electrical components of any particular size or shape or type, or even to providing only standoff components or such components repackaged as by taping.

BRIEF DESCRIPTION OF THE DRAWINGS

The foregoing and other features of the invention will now be more particularly described in connection with an illustrative machine, and with reference to the accompanying drawings thereof, in which.

DESCRIPTION OF THE PREFERRED EMBODIMENT

Figure 1:
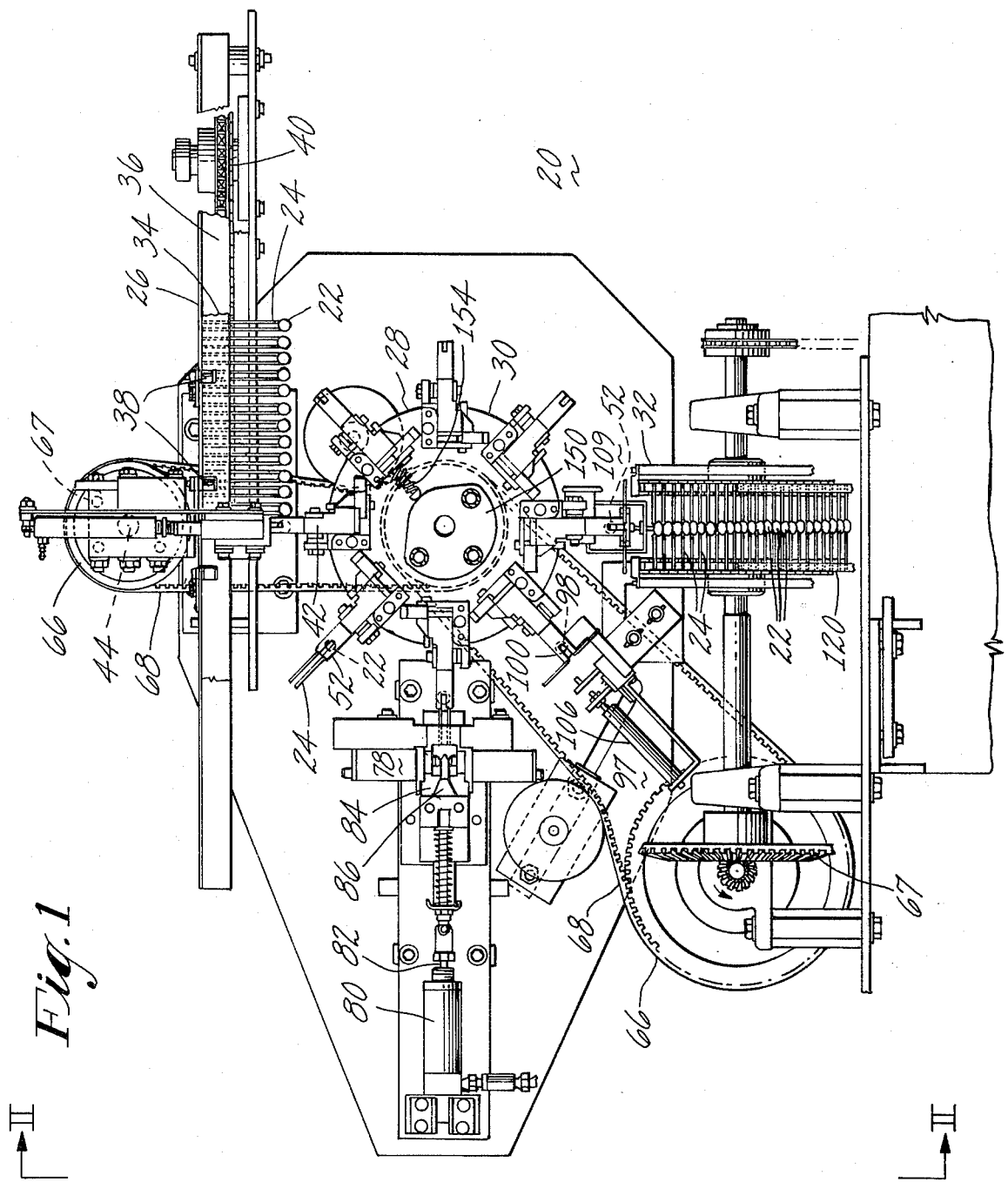
FIG. 1 is a front elevational view of a machine constructed according to the principles of the present invention showing the processing stations thereof, a portion of its frame being removed to show a rotating member and cam follower embodiment.

Referring to the drawings in detail, and particularly to FIG. 1, there is shown a component reforming and repackaging machine 20. The components processed are preferably any selected electrical component 22 having at least two generally parallel leads 24 extending from their bodies. Upon completion of the process, the leads 24 will be coaxial leads.

The machine 20 comprises a component supply arrangement 26 that feeds the electrical components 22 onto a conveying arrangement 28. The conveying arrangement 28 includes a wheel 30 that rotates to bring each electrical component 22 thereon to a succession of processing stations, whereupon the leads 24 are reformed from the generally parallel configuration to a generally coaxial configuration. The final operation includes unloading the reformed components 22 on to a taping and reeling arrangement 32 or alternatively they may be unloaded directly into a printed circuit board component inserting machine, which will be mentioned below.

More particularly, the component reforming and repackaging machine 20, as shown in FIG. 1, with its component supply arrangement 26, includes a generally linear presentation of electrical components 22 taped to a narrow strip of cardboard 34, or the like. The cardboard strip 34 is held against a support channel 36 by a plurality of rotatable channel-biased wheels 38 that permit movement therebetween, yet prevent the strip 34 from falling from the channel 36. An endless chain 40 is movably supported in the horizontal plane just beneath the channel 36. The chain 40 has protrusions thereon which engage the leads 24 of the components 22. The chain 40 moves and causes the cardboard strip 34 and the components 22 thereon to move along the channel 36 to a first processing station.

Figure 2:
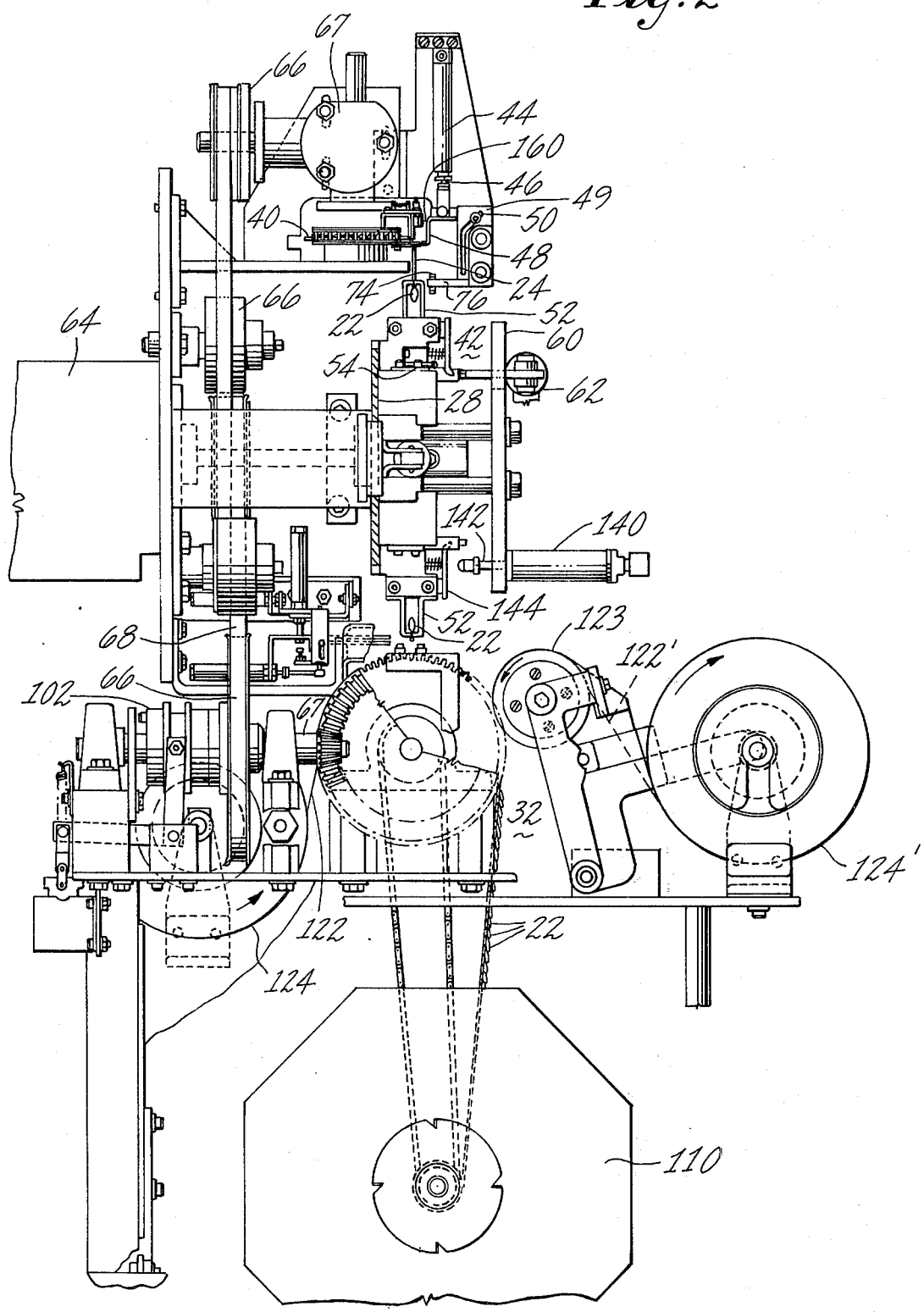
FIG. 2 is a partial view taken along the lines II—II of FIG. 1.
Figure 3:
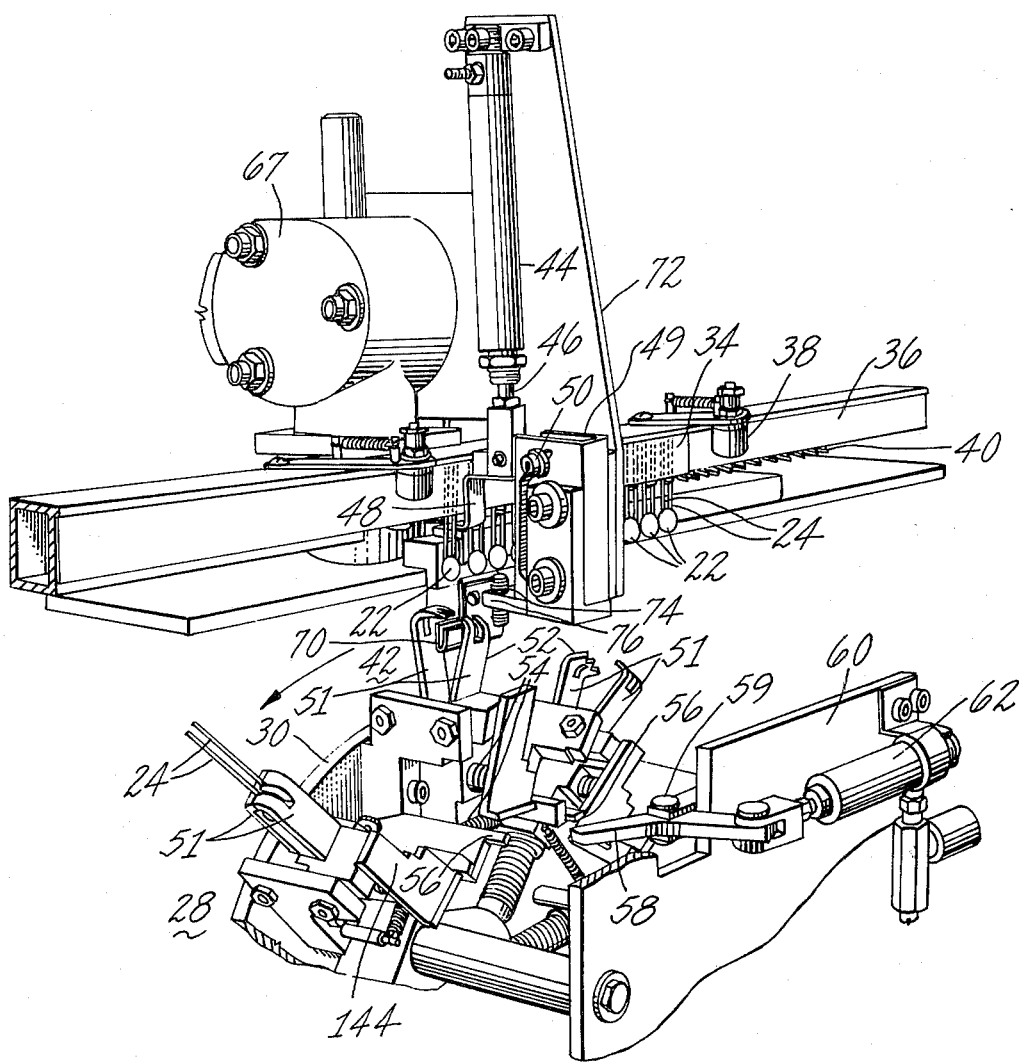
FIG. 3 is a perspective view of a portion of the rotary member and a component supply means at its first processing station.

The components 22 therefore are successively moved to the first component processing station 42 which is shown more clearly in FIGS. 2, 3, 4 and 5. The first processing station 42 comprises a pressure activatable pivotable piston cylinder 44 mounted generally vertically adjacent the cardboard strip 34 which carries the linear array of components 22. The pressure activatable piston cylinder 44 has a piston rod 46 extending therefrom. A finger 48 is attached to the lower end of the piston rod 46. The finger 48 has a cam and follower mechanism 50 associated with a frame member 49 of the machine 20 that permits the finger 48 to approach each component 22 as the piston cylinder 44 is activated. The piston cylinder 44 pivots about its uppermost end permitting the two-direction motion of the cam and follower mechanism 50. The cam and follower mechanism 50 thereupon guides the finger 48 while it pushes the component out of engagement with the tape covered cardboard strip 34 and into a pair of open jaws 51 comprising grippers 52 which are mounted in a spaced relationship on the circumference of the rotary wheel 30. Each jaw 51 has a pivotal relationship with its other respective jaw 51 both of which comprise a gripper 52. The grippers 52 are caused to close about a point on the leads 24 of the component 22, which action finishes the loading operation of the first processing station 42. The grippers 52 have a spring 54 that biases them in the closed condition. A spring loaded latch member 56 engages a radially inner end of one of the jaws 51. The latch member 56 may be tripped to permit the jaws 51 of the gripper 52 to snap into the closed condition by a lever 58 pivoted about a pin 59 supported on a front plate 60. The lever 58 is moved by a pressurizable piston cylinder member 62 that is synchronized to the motion of the rotary wheel 30. As each successive component 22 is pushed down into the awaiting open jaws 51 of the gripper 52, the lever 58 trips the latch 56 out of the way so that the jaws 51 snap shut on the leads 24. The rotary wheel 30 then rotates in a counterclockwise direction, in this embodiment, to bring a next open gripper 52 into the loading station 42. The conveying arrangement 28 is rotated by a motor driven indexer 64 as shown in FIG. 2. The indexer 64 also drives, through a system of pulleys 66, gear mechanisms 67 and drive belts 68, the component supply arrangement 26, and the taping and reeling arrangement 32.

Figure 4:
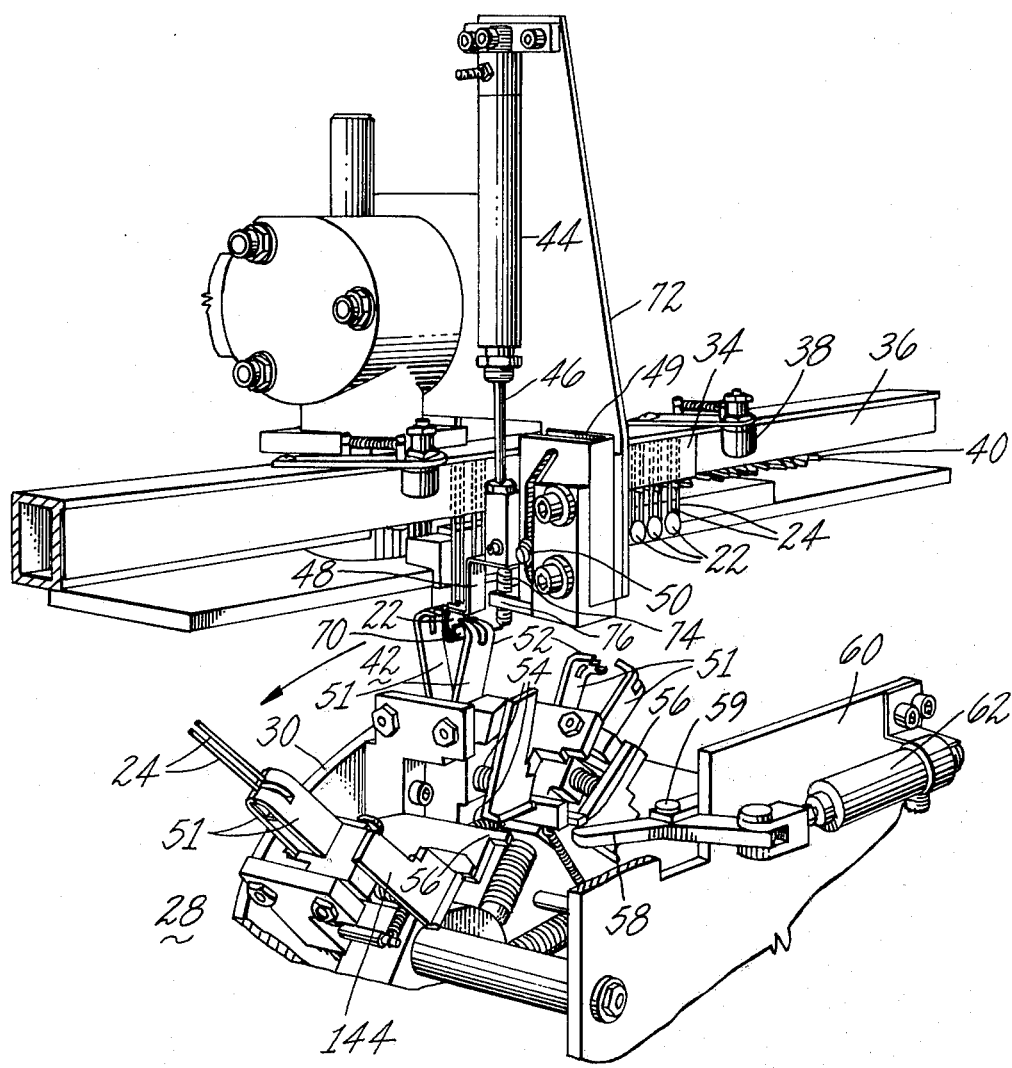
FIG. 4 is a view similar to FIG. 3 but in a further sequence of operation.

The component supply arrangement 26 and the rotary wheel 30, each driven by the indexer 64, are shown in a later sequence of operation in FIG. 4. The finger 48 which is attached to the lower end of the vertically disposed piston rod 46 is at its lowest point of travel and has moved a component 22 from its loading strip 34 to a clip 70 that is supported from the frame 49 just radially inwardly of the jaws 51 of any gripper 52 as it waits its turn in the first processing station 42. The clip 70 has a cross section that is channel shaped in this embodiment to permit seating of the component 22 therein. After closing of the jaws 51 upon the leads 24, the body of the component merely slides out of the clip 70 in a circumferential direction as the rotary wheel 30 moves the gripper 52 to its next processing station. The vertically mounted piston cylinder 44 is mounted in a vertically disposed bracket 72 which is attached to the frame 49 of the machine 20. A set screw 74 is adjustably arranged on a lip portion 76 of the radially innermost end of the bracket 72. The set screw 74 prevents excessive travel of the finger 48 in the radially inward direction, and it also permits flexibility in receiving any desired lead 24 length of any component 22 utilized therewith.

Figure 5:
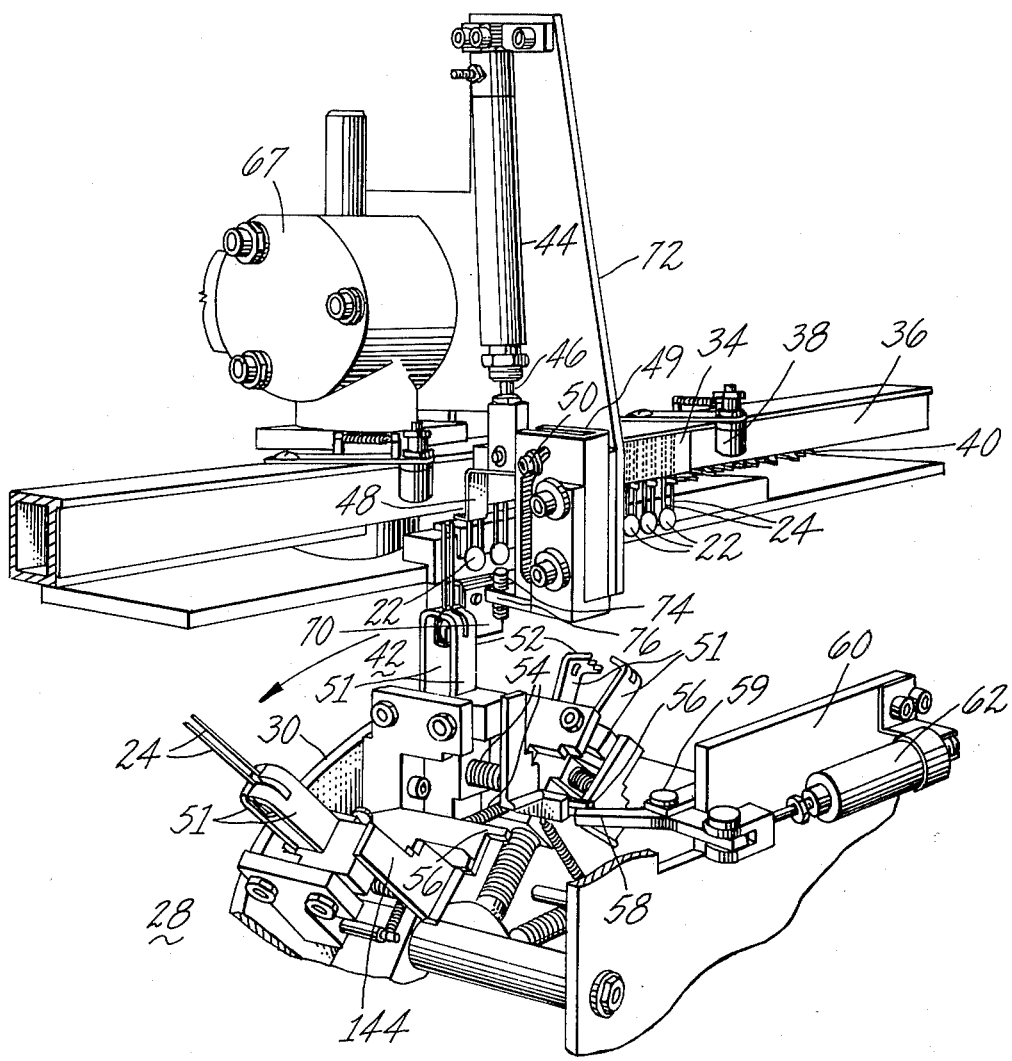
FIG. 5 is a view similar to FIG. 4 but in a still further sequence of operation.

FIG. 5 shows the vertically oriented gripper 52 in its loaded condition and the piston rod 46 in its withdrawn state within the piston cylinder 44. The rotary wheel 30 shown in FIG. 6 has the loaded gripper 52 in a second processing station 78. The second processing station 78 comprises a generally horizontally directed piston cylinder 80 having a piston rod 82 therewith. The piston rod 82 is in engagement with a plunger mechanism 84. The plunger mechanism 84 comprises a multiple-sided cam member 86, a pair of cam followers 88, and a pair of pivotally-biased arms 90, one attached to each cam follower 88, which is shown more clearly in FIG. 7. Each pivotally-biased arm 90 is rigidly attached to a rotatable rod 91, which is movable also along its longitudinal axis and biased by a spring member 93 toward the multiple-sided cam member 86. Each pivotally-biased arm 90 also haa a tab portion 92 directed toward and disposed between one another. Each tab portion 92 has an extremity or lip member 94 on its furthermost end from is respective arm member 90. Each arm 90 is also biased by a spring 96 about a pivot point, which comprises the axis of the rods 91. A cam follower 95 is disposed on the radially outer end of each pivotally-biased arm 90. A cam surface 87 is disposed on the back side of the multiple-sided cam member 86, and a cam surface 99 is disposed on the top and bottom sides of the multiple-sided cam member 86.

Figure 6:
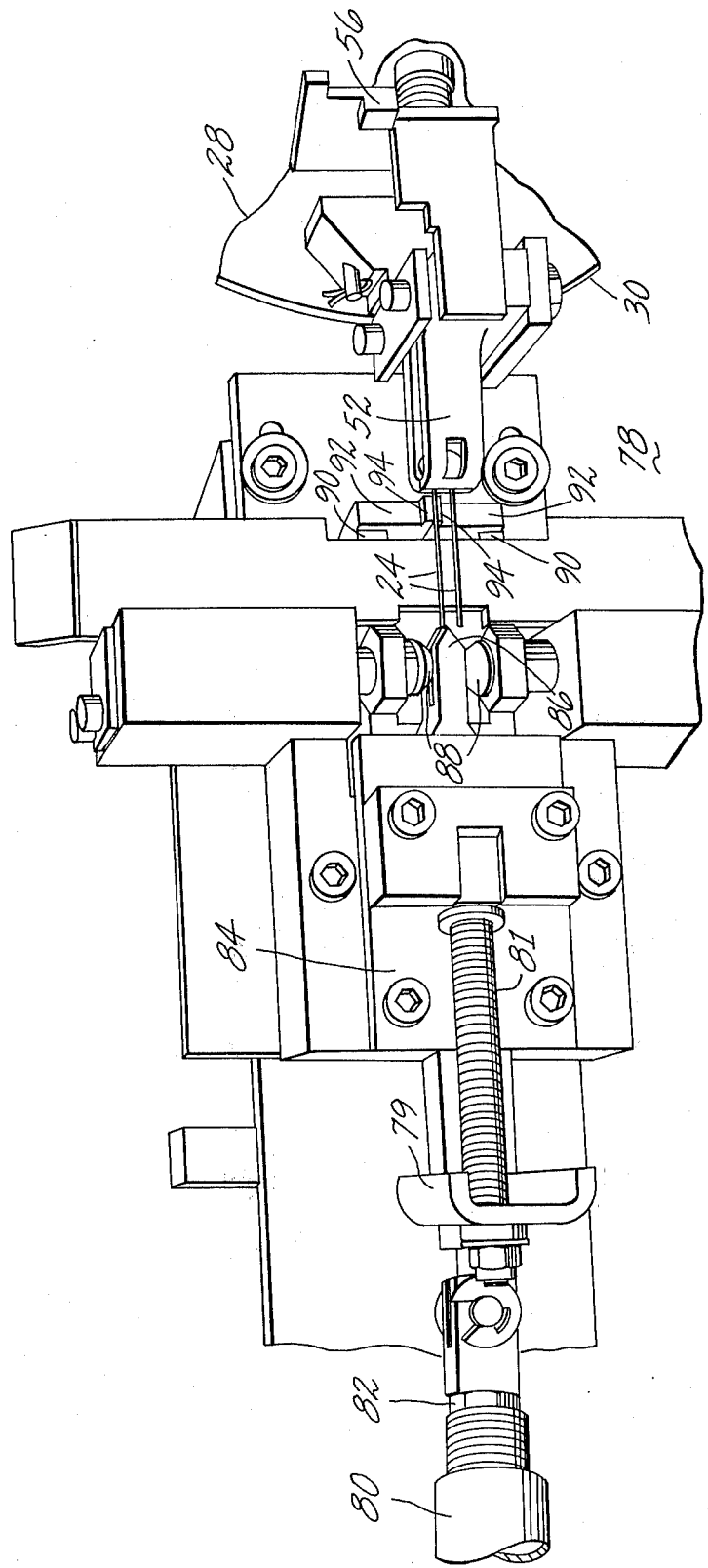
FIG. 6 is a partial perspective view of the machine including the rotary member at the initial stages of operation at its second processing station.
Figure 7:
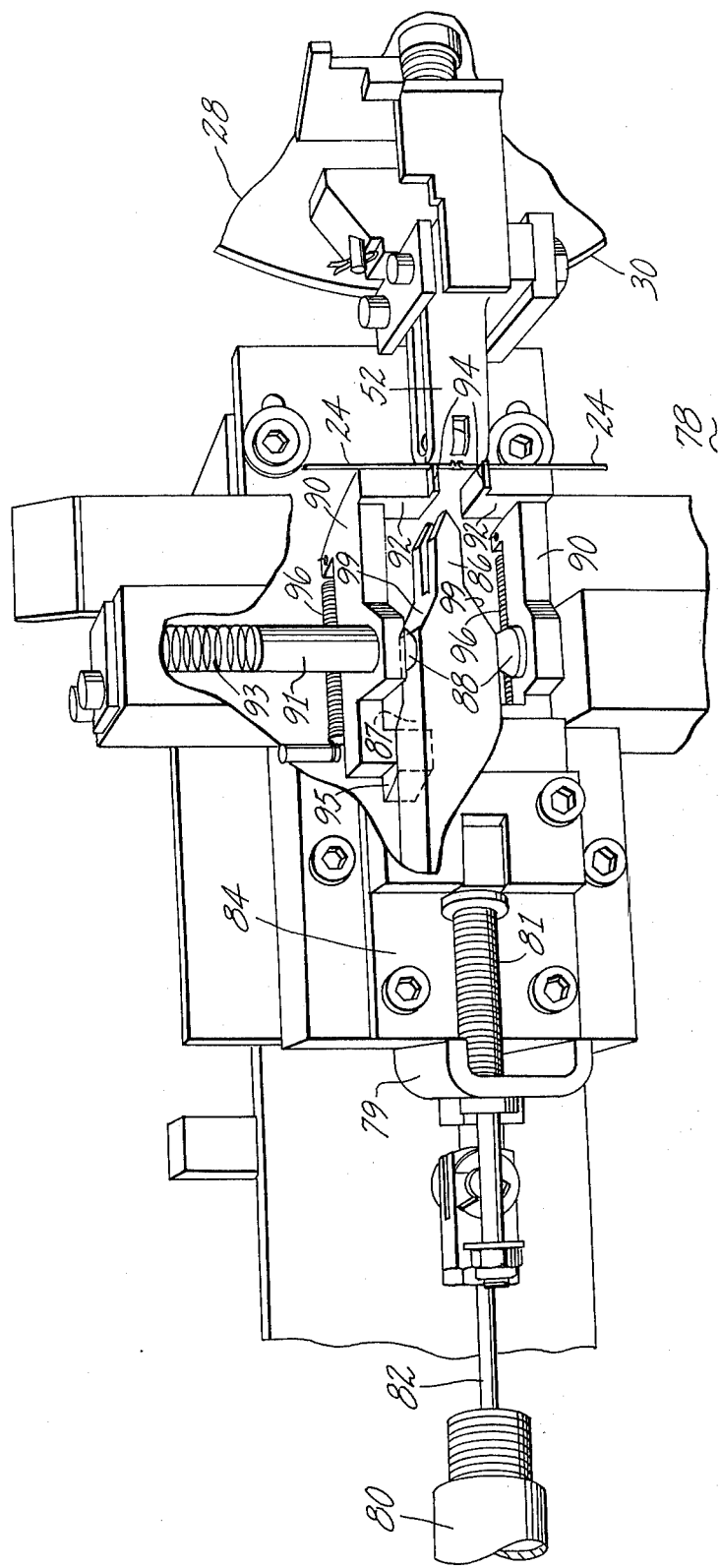
FIG. 7 is a view similar to FIG. 6 but in a further sequence of operation.

As the piston cylinder 80 of the second processing station 78 is pressurized, the piston rod 82 is extended radially inwardly toward the center of the conveyor member 28. The piston rod 82 causes the cam member 86 to move in the same direction to the right, as shown in FIGS. 6 and 7. The cam followers 88 ride apart of the cam surfaces 99 of the cam member 86.

Immediately before the cam followers 88 follow the cam surfaces 99, the biased arms 90 swing in a direction transverse to and just in front of the direction of travel of the cam member 86. This is because the cam follower 95 on each arm 90 rides on the cam surface 87 on the back side of the multiple-sided cam member 86 just prior to the pair of cam followers 88 meeting their respective cam surfaces 99. This causes the arms 90 to pivot about the rods 91. That is, the lip members 94 become disposed between the radially outwardly extending component leads 24. The cam followers 88 thereupon cause the arms 90 and, hence, the lips 94 to move apart from one another. This action causes a bending and reforming of the leads 24 from a generally parallel orientation to one that is generally coaxial. Upon activation of the proper signal the piston cylinder 80 of the second processing station 78 is depressurized, and a spring 81 attached to a bracket 79 pushes the piston rod 82 back into the piston cylinder 80, causing the plunger mechanism 84 to move radially away from the conveyor member 28, which in this embodiment is to the left, as shown in the drawings. This causes the cam followers 88 to bring the arms 90 to pivot so that both the lips 94 are pulled away from the plane defined by the pair of reformed leads 24. The leads are reformed to a standoff length, which comprises their proximal ends, or the length of leads which will support the component body above the circuit board; the remaining portions, or the distal ends of the leads, which are cut and formed or bent for clinching plus a range of selected leg spacing as dictated by the spacing of preformed lead receiving holes in the board. It is to be noted that the leads 24 could be formed to configurations other than coaxial. For instance, they could have an obtuse and/or an acute angle with their standoff portions by appropriately contouring the edges of the lips 94 that actually bend the leads 24.

Figure 8:
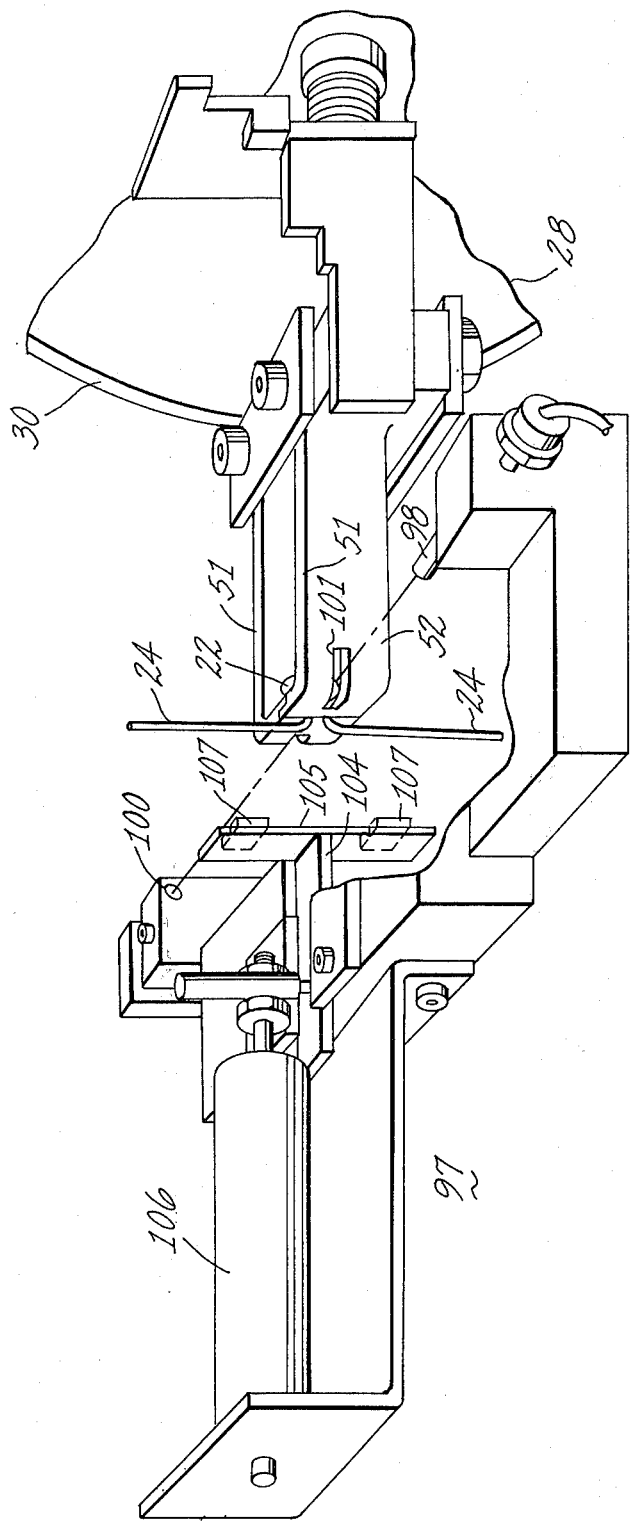
FIG. 8 is a partial perspective view of the machine at the initial stage of operation at its third processing station.
Figure 9:
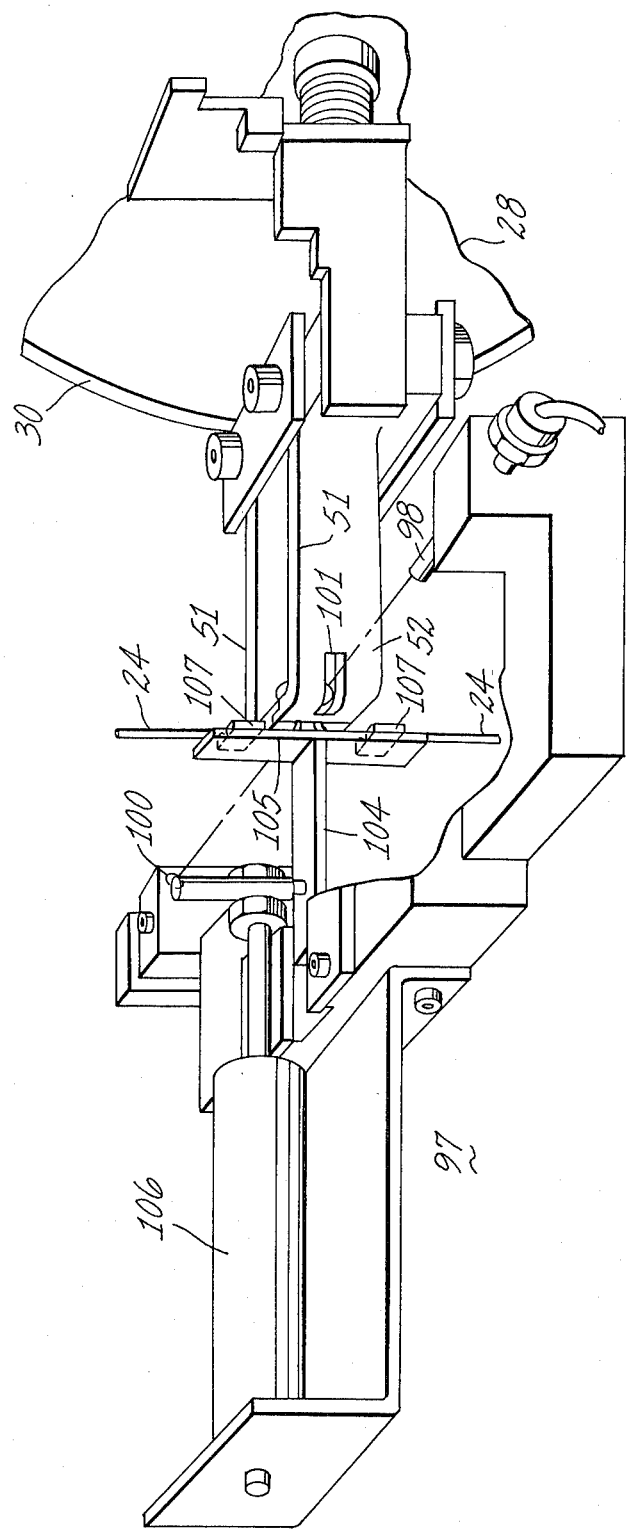
FIG. 9 is a view similar to FIG. 8 but in a further sequence of operation.
Figure 10:
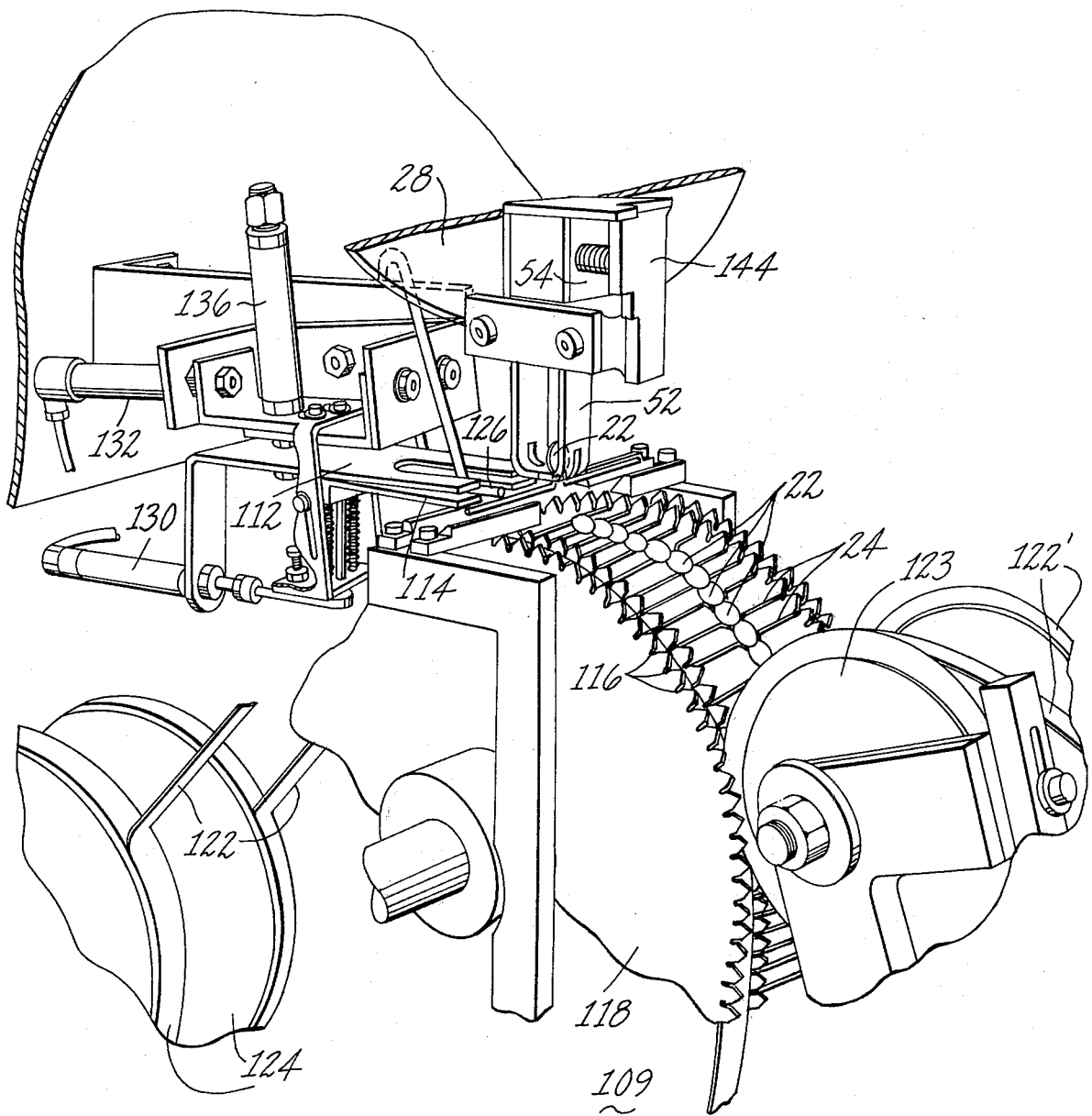
FIG. 10 is a partial perspective view of the machine in the initial stage of operation at its fourth and final processing station.

The rotary wheel 30, which comprises the conveyor member 28, may then rotate to a next processing station 97, as shown in FIGS. 8 and 9, wherein a light emitter 98 and a sensor 100 determine whether there is a component 22 between the jaws 51 of each gripper 52 going therepast. Each jaw 51 has a slot 101 through which a beam of light from the emitter 98 may pass. If the light is received by the sensor 100 then no component 22 is indicated as being disposed within the gripper 52.

If perchance there actually is no component 22 within the gripper 52, the sensor 100 sends a signal to a declutching mechanism 102, which is shown in FIG. 2 and described later. If a component 22 is, however, disposed within the gripper 52, a T-shaped plunger 104 is moved toward the component because a proper signal is thereupon sent to another piston cylinder 106 supported by the frame 49 of the machine 20. This piston cylinder 106 pushes the T-shaped plunger 104 in a radially inwardly direction toward the conveyor member 28 to further form the leads 24 in a true 90° angle. It is to be noted that the plunger 104 could be "arrow" shaped instead of the preferred T-shape. The plunger 104 has arm portions 105. Each arm portion 105 has a groove 107 extending therealong. The grooves 107 receive and insure that the leads 24 line up correctly prior to a discharge of the component at a final processing station 109, as shown in FIGS. 10 through 14. The conveyor member 28 at this last station discharges the components 22 on to a tape system for winding upon a reel or spool 110, which is shown in FIG. 2.

As the gripper 52 is rotated to the unloading or discharging processing station 109, an upper and a lower pair of bifurcated fingers 112, 114 move to grip the leads 24 and place them in spaced arrays of crenels 116. The leads 24 extend beyond the sides of the fingers 112, 114. Each array of crenels 116 is disposed on the periphery of a rotating pickup wheel or disc 118. Each rotating disc 118 has a circumferentially disposed trough 120. A strip of tape 122 is fed across each trough 120, sticky side out, from a pair of tape reels 124, shown in FIG. 10, which feed the tape 122 thereto. An additional tape cover is shown in FIG. 2, where another pair of tape reels 124' feeds a pair of strips of tape 122', around a pair of rollers 123, the rollers 123 pressing their peripheries into the trough 120 to insure contact between the mating sticky surfaces of the tape 122 and 122' which is sandwiched about each end of the leads 24. The components 22 attached to the reformed leads 24 are disposed then between parallel strips of the double layers of tape 122 and 122'. The components may then be wound on the take-up reel 110.

Figure 11:
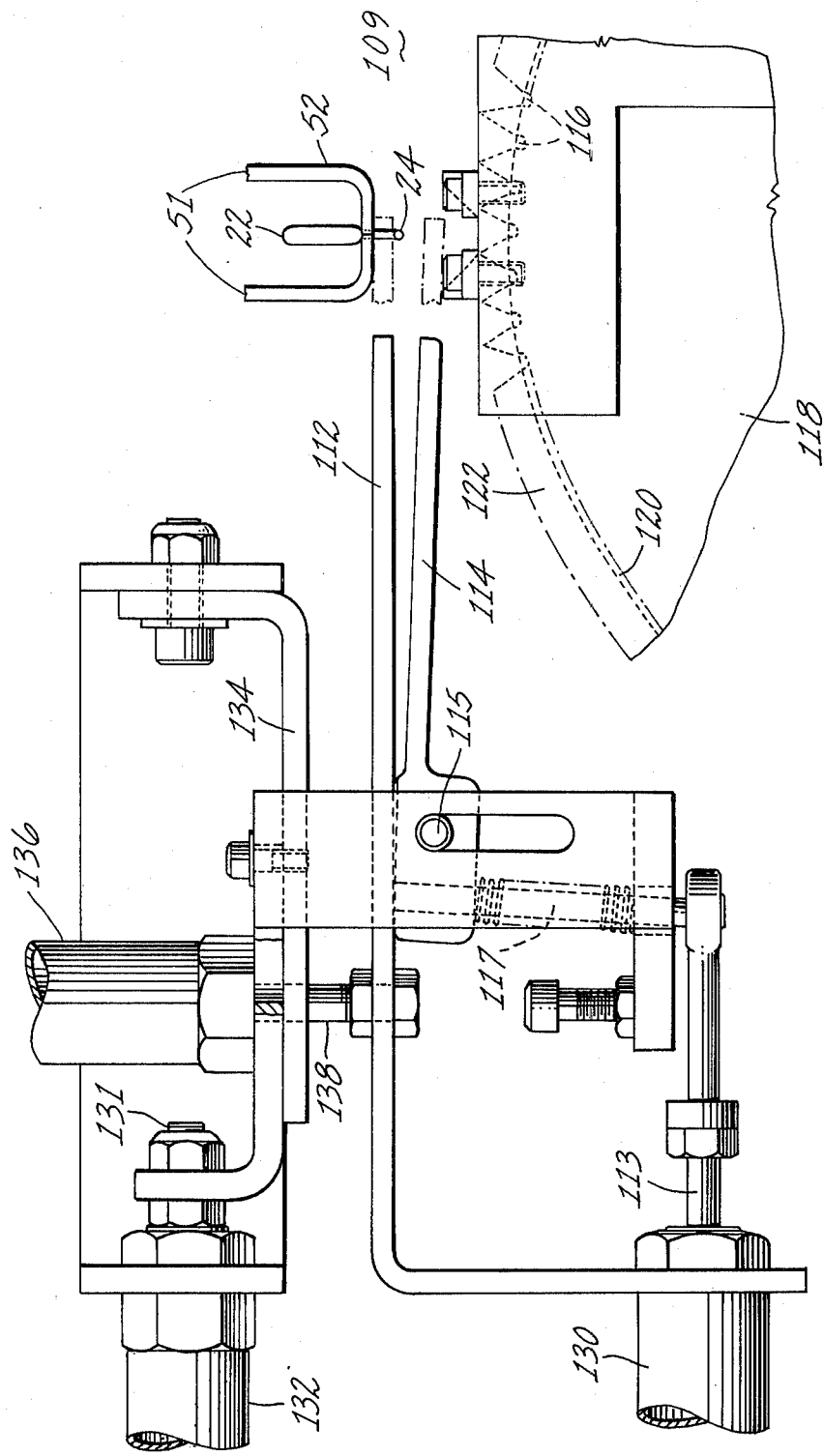
FIG. 11 is a partial side elevational view of the fourth processing station in a further sequence of operation.
Figure 12:
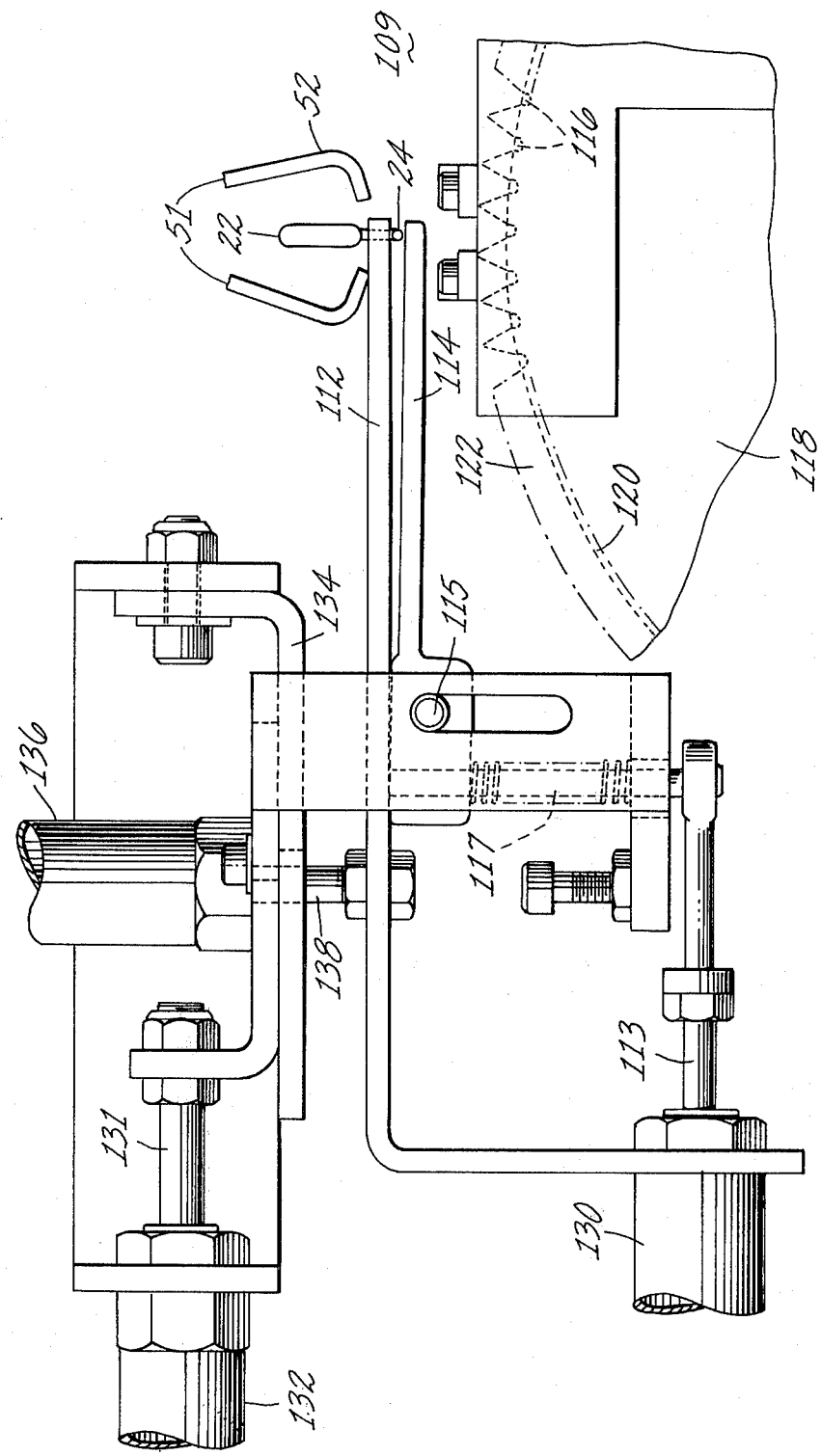
FIG. 12 is a view similar to FIG. 11 on the fourth processing station but in a still further sequence of operation.

Returning to FIG. 10, wherein there is shown a pressurized air nozzle 126 that blows air upon the components 22 just prior to the disposition of the second layer of tape 122'. The pressurized air causes the components 22 to lay in a generally flat manner, permitting easier and more efficient winding and storage thereof on the reel 110. At the initial point in the discharge operation, the gripper 52 is radially adjacent the pickup wheel 118. Upon activation of the proper signal the bifurcated fingers are caused to move their position as shown in FIG. 11 to that in FIG. 12 by pressurization of a first piston cylinder 132. Whereupon the lower pair of bifurcated fingers 114 are caused to be pivoted by a pressurization of a second piston cylinder 130 whereupon a piston rod 113 and an arm 117 swing about a generally horizontal pivot pin 115 to permit the pairs of bifurcated fingers 112 and 114 to be generally parallel with one another. The first piston cylinder 132 has a piston rod 131 therewith and is attached to a frame 134, which supports both bifurcated fingers 112 and 114. Activation of the first piston cylinder 132 causes the fingers 112 and 114 to move toward the leads 24 where they are held by the gripper 52. In proper sequence, and upon a proper signal, the second piston cylinder 130 is activated to cause the lower bifurcated finger 114 to pivot upwardly about the pivot pin 115. The first piston cylinder 132 is pressurized to move both the upper and the lower bifurcated fingers 112 and 114 around the leads 24 of the component 22, as shown in FIG. 12. The jaws 51 of the gripper 52 move apart because a piston cylinder unit 140, as shown in FIG. 2, upon a proper signal, is pressurized, which causes the moving of a piston rod 142 against a strike plate 144, which compresses the spring 54 and permits the biased latch 56 to swing on to the strike plate 144.

This holds the jaws 51 apart since the jaw 51 on the front side of each gripper 52 is fixedly attached and pivotable with its respective strike plate 144. The biased latch 56 shown in FIG. 4 then pivots across the front of and hooks on to the strike plate 144 and holds the gripper 52 open to permit release of the component 22.

The gripper 52 stays in the open condition until it is triggered shut. This occurs back in the first processing station 42 by the piston cylinder 62 "unlatching" the latch 56 by knocking it off its holding position, as explained earlier.

Figure 13:
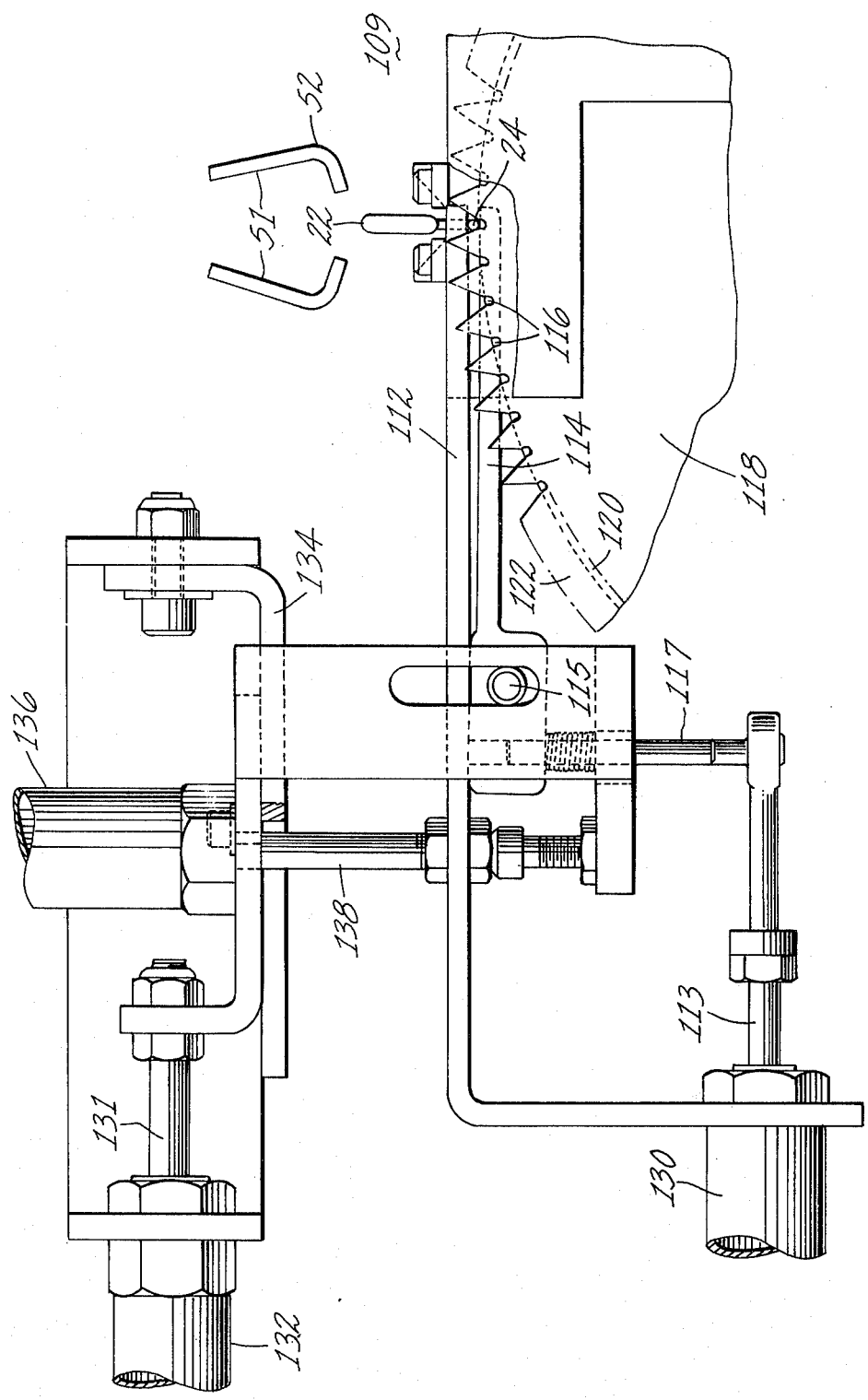
FIG. 13 is a view similar to FIG. 12 at the fourth processing station in yet another sequence of operation.

A third piston cylinder unit 136, which is generally vertically oriented in this example, as shown in FIGS. 11 through 14, is also attached to the bifurcated finger support frame 134 and causes vertical movement thereof. Upon pressurization of the third piston cylinder 136 upon a proper signal, a piston rod 138, which movably passes through the frame 134, is rigidly attached to the upper bifurcated finger 112 and extends downwardly to permit the displacement of the component 22 radially away from the vicinity of the gripper 52 into one pair of crenels 116, one each on the periphery of each synchronized intermittently rotatable pickup wheel 118. The leads 24, which overhang beyond the outer edges of the bifurcated fingers 112 and 114 each touch the outwardly directed sticky surface of the tape 122 lying in the trough 120 of the pickup wheel 118, as shown in FIG. 13.

Figure 14:
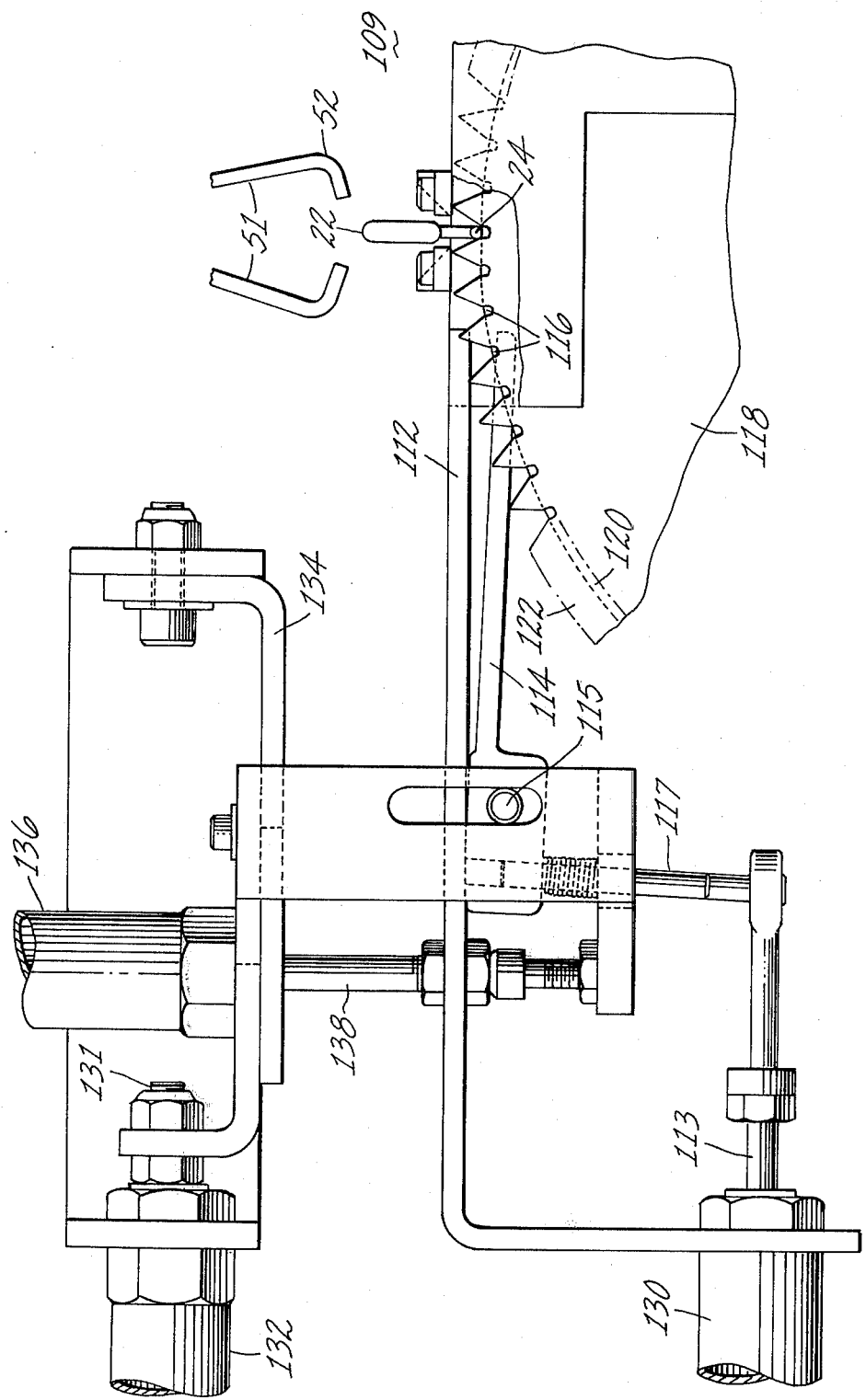
FIG. 14 is still another view of the fourth processing station in its final sequence of operation.

Depressurization of the second piston cylinder 130 causes the piston rod 113 to retract, making the lower bifurcated finger member 114 pivot about the pivot pin, as shown in FIG. 14. The first piston cylinder 132 is depressurized to cause the withdrawal of the rod 131 and attached frame 134. This completely releases the component 22 to the sticky tape 122 in the pickup reel 118 whose leads 24 are then stuck thereto, and whose leads 24 extend into their respective crenels 116. The pickup wheel 118 thereupon rotatably advances one crenel 116 due to a signal sent to the indexer 64 from a response from the previous station 97. The pickup wheel 118 has a declutch mechanism 102 that permits the intermittent rotative motion thereof upon a stated signal.

Figure 15:
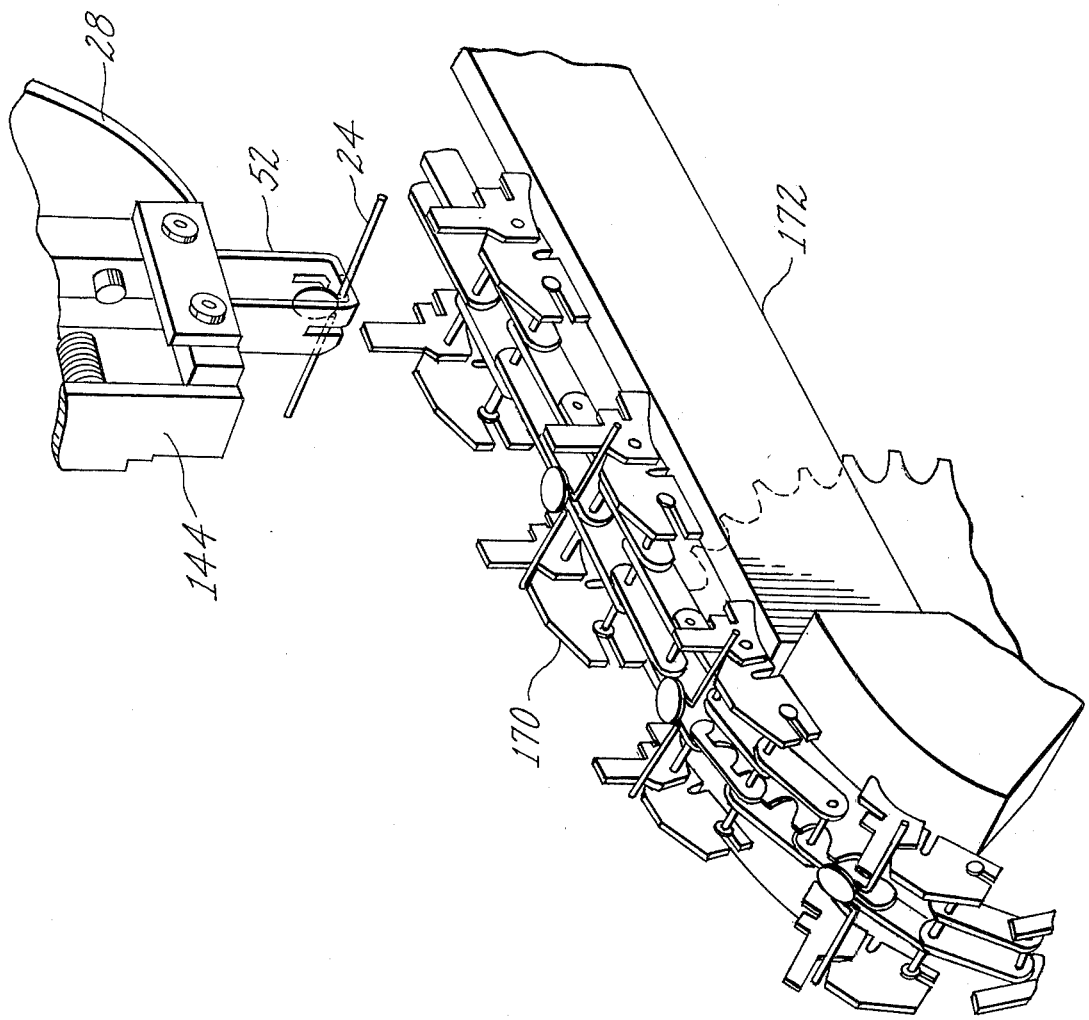
FIG. 15 is an alternative embodiment of the fourth processing station showing a modified component release and pickup mechanism.

The machine 20 repeats the cycle each time a gripper 52 receives a component 22 at the loading operation station 42. The taped reformed components 22 are then wound on the takeup reel 110 ready for installation later in a component inserting machine or for hand installation into circuit boards. Alternatively, the machine 20 may directly feed a pickup belt 170 of a component inserting machine 172, as shown in FIG. 15, instead of having the components wound on a takeup reel 110.

In another alternative embodiment, the rotary wheel 28 could revolve around a cam member 150, as shown in FIG. 1. Each gripper 52 would have a cam follower 154 on its radially inner end which could thereby permit changing the length of the leads 24 from what they were as presented normally in the supply strip 34 because the radial distance that the gripper 52 could change due to the action between the cam 150 and follower 154. Additionally, a cutting blade 160, as shown in FIG. 2, could be attached to a radially outer point on the finger member 48 which would sever the leads 24 just as the finger member 48 engages the component 22.

It is therefore seen that the present invention provides a machine which will receive linear packages of components having generally parallel leads as merchandised by manufacturers and automatically reform the leads to convenient lengths and configurations, which make them ready to insert in printed circuit boards, either by machine insertion or hand insertion.

Though the invention has been described with a certain degree of particularity, it is understood that it is the claims that define the invention which are not to be interpreted in a limiting sense.

We claim:

1. A machine for processing components having generally parallel leads extending from one side of their bodies, respectively, comprising:
   conveyor means movable from a loading station, through successive processing stations, to an unloading zone;
   uniformly spaced lead grippers mounted on said conveyor means for controlling portions of the leads adjacent to their respective bodies;
   means on at least one subsequent station for cooperating with said grippers to bend the distal ends of said leads carried thereby into coaxial relation with one another and substantially at right angles with respect to their proximal ends which comprise said components' standoff lengths;
   a lead taping mechanism, and means for transferring the successive formed components from the conveyor grippers with their coaxial lead portions in position to be taped by the lead taping mechanism.

2. A machine as recited in claim 1 wherein said conveyor means is in the form of a rotary wheel, and operating movement of the grippers is controlled by a biased latch that is pivoted into and out of association with said grippers.

3. A machine as recited in claim 1 wherein said grippers comprise a pair of jaw members that are biased in the closed condition until they are opened by a pressurizably controlled plunger means whereupon said biased latch swings to hold said jaws apart.

4. A machine as recited in claim 1 wherein a pressurizably controlled plunger means is used to close said grippers by pivoting an arm about a point, wherein said arm releases said biased latch from its association with said grippers, the jaws of said grippers thereupon snapping shut.

5. A machine as recited in claim 1 wherein a mechanism is provided for reeling up the components when taped by said taping means which includes:
   a declutchable motorized indexer that is operatively connected to drive said taping means, and a sensor for checking on the presence and position of each component to be presented by said grippers to said taping means controls a circuit for declutching said motorized indexer when a component is missing or mispositioned.

6. A machine as recited in claim 1, wherein said means for cooperating with said grippers to bend said leads includes:
   a power driven plunger arrangement;
   a multisided cam member reciprocally movable toward and away from said components carried on said rotary wheel;
   a first pair of cam followers attached respectively to a pair of arms, said arms having extremities which move into place between said leads, said extremities being movable apart from one another to bend said leads which extend out of the jaws of said grippers;

a second cam follower movable by said multisided cam member, said second cam follower causing said arms to move into place between said leads, and to return said extremities of said arm out of the plane of said leads upon withdrawal of said reciprocally movable multisided cam member.

7. A machine as recited in claim 1 wherein said means for cooperating with said grippers to bend said leads also includes:
   a generally T-shaped reciprocally movable plunger having grooved arms;
   a pneumatically operable means for reciprocally moving said movable T-shaped plunger;
   said leads mating into said grooves in said arms to insure a generally 90° bend therein;
   said sensor for checking the presence and position of each component presented by said grippers being disposed at said subsequent station.

8. A machine as recited in claim 7 wherein said motorized indexer is declutched from driving said lead taping mechanism to permit a continuity of components to be applied thereon.

9. A machine as recited in claim 8 wherein said taping means also includes:
   a pair of pickup wheels each having an array of crenels spaced upon their peripheries;
   each of said wheels also having a circumferentially directed channel therearound;
   a pair of tape supply reels which supply tape, sticky side up, into longitudinal association with said circumferentially directed channels;
   said grippers releasing said components to placement means which inserts each pair of coaxial leads across said crenels in each pickup wheel, each lead adhering to said tape in its respective channel;
   a second pair of tape supply reels that supply tape sticky side down into said channel, said taping being pressed against said leads and said sticky side up tape by a pair of rollers that rollingly mate with said channels immediately after said crenels each have a component lead inserted thereacross, said pickup wheels intermittently rotated to receive new components.

10. A machine as recited in claim 9, wherein said placement means comprises:
    at least one set of movable bifurcated fingers comprised of an upper pair of fingers and a lower pair of fingers;
    a second pressurizable piston cylinder which has a piston rod whose movement permits a pivotal response in said lower set of bifurcated fingers;
    a first pressurizable piston cylinder which has a piston rod attached to a frame which supports both pairs of bifurcated fingers, the movement of said piston rod permitting longitudinal travel of said bifurcated fingers;
    a third pressurizable piston cylinder disposed on said frame and having a piston rod attached to said bifurcated fingers so as to permit vertical movement therewith;
    said first, second and third pressurizable piston cylinders being actuatable upon a signal which causes said bifurcated fingers to move toward and grasp said leads of said components from the jaws of said grippers as they are opening, and place said leads across said crenels as each unfilled crenel is presented on said rotating pickup wheel.

11. A machine for processing components which have generally parallel leads extending from one side of their bodies, said machine comprising:
    conveyor means movable from a loading station;
    uniformly spaced lead grippers mounted on said conveyor means for controlling portions of leads adjacent to their respective bodies;
    means at said loading station for shearing said leads of each component as it is moved by a power actuated member from a component supply arrangement to said grippers; and
    means on at least one subsequent station for cooperating with said grippers to bend the distal ends of said leads of said components; the proximal ends of said leads comprising the standoff lengths of said components above a mounting board.

12. A machine as recited in claim 11, wherein said conveyor means comprises a rotary wheel, and the operating movement of said grippers is controlled by a cam associated with said rotary wheel.

13. A machine as recited in claim 12, wherein said grippers release said component leads to a pickup belt, said pickup belt comprising the receiving arrangement for a component assembling machine.

14. A machine as recited in claim 13 wherein said leads are reformed to be substantially coaxial whith one another.

* * * * *